United States Patent [19]

Schwab et al.

[11] Patent Number: 4,857,406
[45] Date of Patent: Aug. 15, 1989

[54] MICROCAPSULES WITH POLYSALT CAPSULE WALLS AND THEIR FORMATION

[75] Inventors: Gerhart Schwab; Richard L. Brandon, both of Chillicothe, Ohio

[73] Assignee: The Mead Corporation, Dayton, Ohio

[21] Appl. No.: 36,658

[22] Filed: Apr. 10, 1987

[51] Int. Cl.$^4$ .............................................. B01J 13/02
[52] U.S. Cl. ........................ 428/402.22; 71/DIG. 1; 264/4.3; 264/4.7; 424/455; 424/497; 424/501; 503/215; 525/936; 526/219.5; 526/909
[58] Field of Search ..................... 264/4.7, 4.3; 428/402.22; 424/455, 497; 525/936; 526/909, 219.5; 523/502

[56] References Cited

U.S. PATENT DOCUMENTS

| | | | |
|---|---|---|---|
| 3,427,250 | 2/1969 | Haas et al. | 428/402.22 |
| 3,704,264 | 11/1972 | Gorman | 428/402.22 |
| 3,728,318 | 4/1973 | Hamann et al. | 526/909 X |
| 4,090,991 | 5/1978 | Fukusaki et al. | 523/502 |
| 4,251,386 | 2/1981 | Saeki et al. | 264/4.7 |
| 4,328,119 | 5/1982 | Iwasaki et al. | 267/4.7 |
| 4,423,091 | 12/1983 | Iwasaki et al. | 427/213.34 |
| 4,444,699 | 4/1984 | Hayford | 264/4.7 |
| 4,450,123 | 5/1984 | Egawa et al. | 264/4.7 |
| 4,452,957 | 6/1984 | Neigel | 526/71 |
| 4,455,408 | 6/1984 | Szymanski et al. | 525/291 |
| 4,460,722 | 7/1984 | Igarashi et al. | 523/206 |
| 4,517,351 | 5/1985 | Szymanskie et al. | 527/312 |
| 4,518,547 | 5/1985 | Cuff et al. | 264/4.7 |
| 4,532,183 | 7/1985 | Shackle et al. | 428/402.22 |
| 4,557,755 | 12/1985 | Takahashi et al. | 71/100 |
| 4,608,330 | 8/1986 | Marabella | 430/138 |
| 4,680,200 | 7/1987 | Solc | 526/909 X |
| 4,729,792 | 3/1988 | Seitz | 106/21 |

OTHER PUBLICATIONS

Das Papier, 39, 12, 601 (1985).

*Primary Examiner*—Richard D. Lovering
*Attorney, Agent, or Firm*—Smith & Schnacke

[57] ABSTRACT

The present invention provides a process for forming microcapsules having discrete capsule walls. An emulsion of an oily core material in a continuous aqueous phase containing a polymeric anionic emulsifier, a free radical addition polymerizable cationic monomer and a free-radical initiator is formed. Particles of the oily core material are enwrapped in a polymerizate of the cationic monomer produced by polymerization of the cationic monomer.

16 Claims, No Drawings

MICROCAPSULES WITH POLYSALT CAPSULE WALLS AND THEIR FORMATION

BACKGROUND OF THE INVENTION

The present invention relates to a process for forming microcapsules.

Microcapsules containing solid, liquid and gaseous core materials have been commercially utilized in various applications. One of the most widespread uses of such microcapsules has been in the art of pressure-sensitive copy systems where minute droplets of an oily material containing a chromogenic compound are encapsulated and coated onto an imaging transfer sheet. Upon rupture of the microcapsules under localized pressure, the chromogenic material is transferred by means of the oily vehicle to an underlying developer sheet having an absorbent coating of developer material which reacts with the chromogenic material to produce a visible colored image at points corresponding to where the microcapsules have been ruptured and the chromogenic compound transferred.

Many combinations of materials have been used in the past in search of compositions which yield certain physical characteristics in capsule walls or which permit performing the encapsulation process under certain desired or required conditions. As examples of desirable capsule characteristics, small size, impermeability of capsule walls to diffusion, and strength of capsules walls to withstand normal handling forces are common. As examples of desirable process conditions, relatively short times and relatively high yield and concentration are important.

Various processes have been proposed for producing microcapsules including both chemical and physical phenomena. For example, U.S. Pat. Nos. 4,460,722 and 4,557,755 disclose a process wherein a water-soluble cationic urea resin and a prepolymer composed of formaldehyde and urea or a melamine are condensed in the presence of an anionic surfactant to form the microcapsule wall. U.S. Pat. No. 4,328,119 discloses a process wherein an anion-modified aminoaldehyde resin is polycondensed in the presence of at least one anionic colloid material to form the microcapsule wall. Other processes for forming microcapsule walls are disclosed in U.S. Pat. Nos. 4,251,386; 4,423,091; 4,444,699; and 4,450,123.

Das Papier, 39, 12, 601 (1985) discloses a process for the production of microcapsules having a diameter of about 200-5000 microns by dripping an aqueous solution of the core material and cellulose sulfate into an aqueous solution of a polymer cation.

As a preface to the present process, U.S. Pat. Nos. 4,452,957; 4,455,408; and 4,517,351 teach the reaction of quaternary ammonium monomers and monomers copolymerizable therewith in the presence of anionic polymers to directly form a dry coacervate. The dry coacervate is ground to make a powder useable as electroconductive agents in photographic, fiber, membrane or paper applications. More specifically, the process involves forming a solution of the monomers, the anionic polymer, solvent and a free-radical initiator; polymerizing and drying the solutions at a temperature above the solvent's boiling point; and recovering the dry product. The theory behind the polymerization of the quaternary ammonium monomers and the anionic polymer applies to the present invention.

SUMMARY OF THE INVENTION

The present invention provides a process for forming mononuclear microcapsules having discrete synthetic capsule walls.

In accordance with the present invention, an emulsion of an oily core material in a continuous aqueous phase containing an anionic emulsifier, a cationic monomer and a free-radical initiator is formed. The anionic emulsifier is present at the oil-water interface. The cationic monomer is coulombically attracted to the oil-water interface. Particles of the oily core material are then enwrapped in a polymerizate of the cationic monomer. An object of the present invention is to provide a process for forming microcapsules wherein no formaldehyde is used or evolved.

A further object of the present invention is to provide a process for forming microcapsules which uses wall reaction components which do not react with water.

A further object of the present invention is to provide a process for forming microcapsules wherein the resulting microcapsule wall is essentially insoluble in oil and water.

A more particular object of the present invention is to provide a process for forming microcapsules wherein the emulsion size distribution formed initially can be changed.

Other objects and advantages of the present invention will become apparent from the following description and appended claims.

DETAILED DESCRIPTION OF THE INVENTION

Polymeric anionic emulsifiers useful in the present invention include synthetic, semi-synthetic and natural anionic emulsifiers. The anionic polymer described in U.S. Pat. No. 4,517,351 are useful. Examples of useful anionic emulsifiers include poly(styrene sulfonate) sodium salt, isobutylene-maleic anhydride copolymer, gum arabic, sodium alginate, carboxymethylcellulose, cellulose sulfate and pectin. Preferred anionic emulsifiers include poly(styrene sulfonate) and isobutylene-maleic anhydride copolymer. Poly(styrene sulfonate) is commercially available as Versa TL 500 from National Starch and Chemical Corp. while isobutylene-maleic anhydride copolymer is commercially available as Isobam from Nissho-Iwai American Corporation, New York, N.Y.

Useful cationic monomers include quaternary ammonium salts which contain ethylenically unsaturated groups, e.g., vinyl, acrylate and styryl groups. Phosphonium salts having free radical addition polymerizable moieties may also be useful.

Useful quaternary ammonium salts are represented by the formula (I)

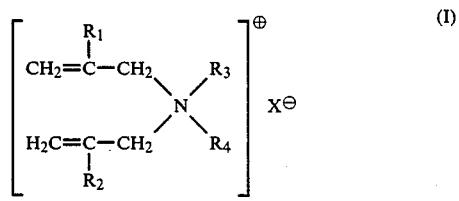

where $R_1$ and $R_2$ are selected from the group consisting of hydrogen and alkyl groups; $R_3$ and $R_4$ are selected from the group consisting of alkyl groups, aryl groups, cycloalkyl groups, hydroxyalkyl groups and alkoxyalkyl groups having 1 to 18 carbon atoms; and X is an anion. Illustrative example of radicals represented by $R_3$ and $R_4$ are methyl to octadecyl groups, inclusive; methoxymethyl and the various higher alkoxy, e.g., methoxy to octadecoxy, inclusive, alkyls, e.g., ethyl to octadecyl groups etc. Examples of anions represented by X are halide ions, sulfate, sulfonate, phosphate, hydroxide, borate, cyanide, carbonate, thiocyanate, thiosulfate, sulfide, cyanate and acetate. Examples of useful monomers are diallyl, dimethyldiallyl, dimethylallyl and diethylallyldimethyl ammonium chlorides, bromides, phosphates and sulfates. Preferably, the cationic monomer is dimethyldiallyl ammonium chloride.

Useful free-radical initiators for the cationic monomer can be photoinitiators or thermal initiators but the thermal reaction is preferred because of easier controllability. Useful initiators are water-soluble and are described in U.S. Pat. No. 4,571,351. Examples of useful free-radical initiators include a system of ferrous sulfate and potassium persulfate and a tri-component system of sodium thiosulfate, sodium carbonate and sodium persulfate.

The oily core material to be encapsulated by this invention can be any material which is substantially water-insoluble and which does not interact with the intended capsule wall material or with the other encapsulation system components to the detriment of the process. Preferred oily core materials are weakly polar or non-polar solvents having boiling points above 170° C., and preferably, in the range of about 180° to 300° C. In one embodiment, the oils used in the present invention are those conventionally used in carbonless paper manufacture. These oils are generally characterized by their ability to dissolve Crystal Violet Lactone in a concentration of 0.5 wt % or more. Examples of useful materials for the core include water-insoluble or substantially water-insoluble liquids such as castor oil, deodorized kerosene, naphthenic mineral oils, mineral oil, dibutyl phthalate, dibutyl fumarate, polychlorinated biphenyls, alkylated biphenyls (e.g., monoisopropyl biphenyl), brominated paraffin chlorinated paraffin, chlorinated α-olefins, and mixtures thereof. Alkylated biphenyls are generally less toxic and preferred.

The oily core material diameter may range from about 3 to 26 microns, and preferably, about 5 to 10 microns prior to wall formation. Conventional emulsion preparation techniques can be followed. Batch or continuous processes may be used.

The system components of the present process can be combined in a number of different sequences. For example, an aqueous phase containing an anionic emulsifier, a cationic monomer and a free-radical initiator can be prepared and an oily core material can be emulsified into the aqueous phase. Polymerization is subsequently initiated by heating or exposure to actinic radiation. In the preferred embodiment, the emulsion is formed by emulsifying the oily core material into an aqueous solution of the anionic emulsifier and with stirring adding an aqueous solution of the cationic monomer and the free-radical initiator to the emulsion.

Typically, the aqueous phase contains about 3 to 6% emulsifier. Optimum amounts will depend on the nature of the core material and the emulsion particle size. If the anionic emulsifier is sodium alginate, the aqueous phase usually contains about 1 to 3% emulsifier. The cationic monomer is typically used in an amount of about 2.5 to 7% by weight based on the continuous phase. As those skilled in the art can appreciate, the cationic monomer is not added as a polymer to the system in order to avoid flocculation of the polysalt pair. The volume ratio of the oil to the water phase is about 5:12 to 7:9.

The percentage by weight of the free-radical initiator used varies over a broad range depending upon the initiator system. An amount sufficient to initiate polymerization of the monomer is used. For example, if the ferrous sulfate and potassium persulfate system is used, about 0.4%, by weight of the system in the aqueous phase is used. If the tri-component is used, about 0.67% by weight of the tri-component system in the aqueous phase is required.

After an emulsion of the oily core material in a continuous aqueous phase containing the anionic emulsifier, cationic monomer and free-radical initiator is formed, the monomer is polymerized. If polymerization is thermally induced, depending on the nature of the initiator, temperatures greater than 65° may be required. Microcapsules prepared by the process of the present invention typically can be prepared with a diameter in the range of about 2 to 40 microns. In a preferred embodiment, the diameter is about 2 to 20 microns, and more particularly, about 5 to 10 microns.

In a preferred embodiment, the oily core material additionally contains an oil-soluble monomer and an initiator for the oil-soluble monomer. In this embodiment, the step of enwrapping the particles of the oily core material additionally includes polymerization of the oil-soluble monomer. This monomer may polymerize with itself or it may copolymerize with the cationic monomer. Examples of useful oil-soluble free radical addition polymerizable monomers are ethylenically unsaturated compounds such as ethylene glycol dimethacrylate, triethylene glycol dimethacrylate, trimethylolpropane triacrylate and trimethyol propane trimethacrylate. A preferred oil-soluble monomer is trimethylolpropane triacrylate.

Although the oil-soluble monomer is optional, it is desirable if low capsule wall permeability is required. The amount of the monomer will vary depending upon its nature and the type of capsule desired. It may range from about 2 to 10% by weight of the oil phase. Typically, the oil-soluble monomer is used in an amount of about 4 to 5.4% by weight based on the oil phase. When 7.2% was used, a stronger wall was formed having very low permeability.

Generally, the internal phase will include an initiator for the oil soluble monomer when one is present. Useful initiators for the oil soluble monomer include thermal initiators such as benzoyl peroxide or azobisisobutyronitrile. Typically, about 0.1 to 0.2% by weight of the initiator in the oily core material is used.

In accordance with one embodiment of the present invention, the microcapsules are used in providing pressure-sensitive recording materials. Dye precursors conventionally used in carbonless paper are useful in the present invention. In general, these materials are colorless electron donating compounds. Representative examples of such dye precursors include substantially colorless compounds having in their partial skeleton: a lactone, a sulfone, a spiropyran, an ester or an amido structure. Specifically, triarylmethane compounds, thiazine compounds and spiropyran compounds are useful. Typical examples include Crystal Violet Lactone, benzoyl leuco methylene blue, Malachite Green Lactone, etc.

Other components can be added to the oily core material in order to strengthen the wall in an otherwise known manner. Examples of such useful additives include trifunctional isocyanate group-bearing polyurethane prepolymers of aliphatic and aromatic character.

The emulsion containing the microcapsules may be either coated directly onto a support material and dried or the microcapsules may be separated from the emulsion by some physical means such as filtration or centrifugation; washed and redispersed in the solution of a binder; coated onto a support and dried.

The coating operation is performed by conventional means such as by the use of an air knife. The capsule coatings are dried at temperatures ranging from about 40° to 100° C.

The support material commonly used in transfer sheet record paper is paper and is, therefore, preferable in the practice of this invention. However, the microcapsules produced by the present process are also capable of being coated onto other materials such as plastic and fabric or textile webs.

In pressure-sensitive record materials, a support carrying a layer of microcapsules prepared as described herein is associated with a developer material. The developer may be carried on the same side of the support as the microcapsules to provide a self-contained recording material or it may be present in a separate layer on the opposite side of the support (to provide a so called CFB sheet) or on a separate support to provide transfer systems.

The present invention is more fully illustrated by the following non-limiting examples.

EXAMPLE 1

3.0 g of Crystal Violet Lactone was dissolved in a mixture of 72 g monoisopropyl biphenyl and 24 g Exxsol D-110 (an aliphatic hydrocarbon with a flash point of 110° C. supplied by the Exxon Co.). 4.0 g of trimethylolpropane triacrylate and 100 mg of azobisisobutyronitrile (AIBN) were added. This oil phase was emulsified into 200 ml of 4.5% aqueous Versa TL 500 solution (polystyrene sulfonate, Na salt) which also contained 14.4 g of 64% aqueous dimethyl diallyl ammonium chloride. After 5 minutes of stirring the emulsion, 0.2 g of ferrous sulfate and 0.6 g of potassium persulfate were added. The emulsion was then heated to 65°-70° C. and stirred at this temperature for 3.5 hours. The resulting capsule dispersion had a diameter size distribution from about 1 to 10 microns with a mean capsule diameter of 4.7 microns.

EXAMPLE 2

64.8 g of monoisopropylbiphenyl and 21.6 g Exxsol D-110 (a high boiling aliphatic hydrocarbon diluent) containing 3.6 g trimethylolpropane triacrylate and 2.7 g Crystal Violet Lactone was emulsified into 180 g of 4.5% aqueous solution of Versa TL 500 [poly(styrene sulfonic acid) sodium salt] at a blender setting of 40 to 50 v for 45 seconds. The emulsion was transferred to a 4-necked flask, 0.18 g azobisisobutyronitrile was added and the mixture was purged with nitrogen. 19.5 g of a 63% aqueous solution of dimethyl diallyl ammonium chloride and a tri-component initiator system consisting of 0.39 g sodium thiosulfate, 0.33 g sodium carbonate and 0.48 g sodium persulfate was added. This mixture was stirred and heated to 65° to 70° C. for 4 hours while a blanket of nitrogen was maintained over it. A capsule size distribution from about 1.3 to 20 microns with a mean diameter of 7 microns was obtained.

When the microcapsules were coated on a paper substrate and placed against a CF developer sheet, blue marks were obtained by pressure application.

EXAMPLE 3

The procedure was the same as in Example 2 with the exception of the cure time shortened to 3 hours. The internal phase was changed to 61.2 g of monoisopropylbiphenyl, 21.6 g Exxsol D-110 and 7.2 g trimethylolpropane triacrylate containing also 2.7 g Crystal Violet Lactone. The internal initiator, azobisisobutyronitrile, was halfed to 0.09 g. Another difference was that the tri-component external initiator was reduced to 0.26 g sodium thiosulfate, 0.22 g sodium carbonate and 0.32 g sodium persulfate. The capsule size distribution was from about 1.3 to 20 microns but in actuality, about 1.5 to 8 microns since only 5% of the capsules were larger than 8 microns with a mean of 3 microns.

A coating of the capsules produced a white sheet which made distinct blue marks against the CF developer sheet upon pressure application.

While the encapsulation process of the present invention has been illustrated with respect to the preparation of pressure-sensitive record materials, the process can be used in other areas, e.g., encapsulation of pharmaceuticals, herbicides, catalysts, and other materials.

Having described the invention in detail and by reference to preferred embodiments thereof, it will be apparent that modifications and variations are possible without departing from the scope of the invention defined in the appended claims.

What is claimed is:

1. A process for forming microcapsules having discrete capsule walls comprising the steps of:

forming an emulsion of an oily core material in a continuous aqueous phase, said aqueous phase containing a polymeric anionic emulsifier, a free radical addition polymerizable cationic monomer represented by the formula

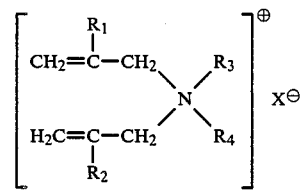

where $R_1$ and $R_2$ are selected from the group consisting of hydrogen and alkyl groups; $R_3$ and $R_4$ are selected from the groups consisting of alkyl groups, aryl groups, cycloalkyl groups, hydroxyalkyl groups and alkoxyalkyl groups having 1 to 18 carbon atoms; and x is an anion; and a free-radical initiator; and polymerizing said cationic monomer so as to enwrap particles of said oily core material in a polymerizate of said cationic monomer.

2. The process of claim 1 wherein said step of forming an emulsion comprises the steps of:

emulsifying said oily core material into an aqueous solution of said anionic emulsifier; and adding an aqueous solution of said cationic, monomer and said free-radical initiator to said emulsion with stirring.

3. The process of claim 2 wherein said anionic emulsifier is an emulsifier selected from the group consisting of poly(styrene sulfonate), isobutylene-maleic anhydride copolymer, gum arabic, sodium alginate, carboxymethylcellulose, cellulose sulfate and pectin.

4. The process of claim 3 wherein said anionic emulsifier is poly(styrene sulfonate).

5. The process of claim 3 wherein said anionic emulsifier is isobutylene-maleic anhydride copolymer.

6. The process of claim 1 wherein said cationic monomer is dimethyl diallyl ammonium chloride.

7. The process of claim 1 wherein said free-radical initiator is an initiator system selected from the group consisting of ferrous sulfate and potassium persulfate, and sodium thiosulfate, sodium carbonate and sodium persulfate.

8. The process of claim 1 wherein said oily core material includes an oil-soluble monomer and an initiator.

9. The process of claim 8 wherein said oil-soluble monomer is an ethylenically unsaturated compound.

10. The process of claim 9 wherein said core initiator is a thermal initiator of free radical polymerization.

11. Microcapsules prepared by the process comprising the steps of:
    forming an emulsion of an oily core material in a continuous aqueous phase said aqueous phase containing an anionic emulsifier, a free radical addition polymerizable cationic monomer represented by the formula

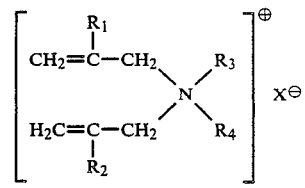

wherein $R_1$ and $R_2$ are selected from the group consisting of hydrogen and alkyl groups; $R_3$ and $R_4$ are selected from the groups consisting of alkyl groups, aryl groups, cycloalkyl groups, hydroxyalkyl groups and alkoxyalkyl groups having 1 to 18 carbon atom; and x is an anion; and a free-radical initiator; and polymerizing said cationic monomer so as to enwrap particles of said oily core material in a polymerizate of said cationic monomer produced by polymerization of said cationic monomer.

12. The microcapsules of claim 11 wherein said step of forming an emulsion comprises the steps of:
    emulsifying said oily core material into an aqueous solution of said anionic emulsifier; and
    adding an aqueous solution of said cationic monomer and said free-radical initiator to said emulsion with stirring.

13. The microcapsules of claim 12 wherein said anionic emulsifier is an emulsifier selected from the group consisting of poly(styrene sulfonate), isobutylene-maleic anhydride copolymer, gum arabic, sodium alginate, carboxymethylcellulose, cellulose sulfate and pectin.

14. The microcapsules of claim 13 wherein said anionic emulsifier is poly(styrene sulfonate).

15. The microcapsules of claim 13 wherein said anionic emulsifier is isobutylene-maleic anhydride copolymer.

16. The microcapsules of claim 11 wherein said cationic monomer is dimethyl diallyl ammonium chloride.

* * * * *